(12) United States Patent
Hao et al.

(10) Patent No.: US 11,570,867 B2
(45) Date of Patent: Jan. 31, 2023

(54) METHOD OF CONTROLLING DRIVING CIRCUIT, DRIVING CIRCUIT, AND LIGHT-EMITTING SUBSTRATE

(71) Applicants: Beijing BOE Display Technology Co., Ltd., Beijing (CN); BOE Technology Group Co., Ltd., Beijing (CN)

(72) Inventors: Wei Hao, Beijing (CN); Lingyun Shi, Beijing (CN); Wenchieh Huang, Beijing (CN); Feifei Wang, Beijing (CN); Wengang Su, Beijing (CN); Rui Shi, Beijing (CN); Xingce Shang, Beijing (CN); Junwei Zhang, Beijing (CN); Kaimin Yin, Beijing (CN); Qibing Gu, Beijing (CN); Lili Jia, Beijing (CN); Xiurong Wang, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 50 days.

(21) Appl. No.: 17/364,679

(22) Filed: Jun. 30, 2021

(65) Prior Publication Data
US 2022/0117059 A1  Apr. 14, 2022

(30) Foreign Application Priority Data
Oct. 9, 2020  (CN) .......................... 202011074439.0

(51) Int. Cl.
H05B 45/46 (2020.01)
H05B 45/18 (2020.01)
H05B 45/14 (2020.01)

(52) U.S. Cl.
CPC ............. *H05B 45/46* (2020.01); *H05B 45/14* (2020.01); *H05B 45/18* (2020.01)

(58) Field of Classification Search
CPC ........ H05B 45/46; H05B 45/14; H05B 45/18; H05B 45/30; H05B 45/50; H05B 47/165;
(Continued)

(56) References Cited

U.S. PATENT DOCUMENTS

2007/0080911 A1* 4/2007 Liu ..................... H05B 45/3725
345/82
2012/0256894 A1* 10/2012 Jang ..................... G09G 3/3648
315/297

\* cited by examiner

*Primary Examiner* — Daniel D Chang
(74) *Attorney, Agent, or Firm* — IPro, PLLC

(57) ABSTRACT

A method of controlling a driving circuit applicable to a light-emitting substrate which includes a light-emitting assembly including a plurality of light-emitting-element strings connected in parallel, each of the plurality of light-emitting strings comprising a plurality of light-emitting-elements connected in series, the driving circuit connected to the plurality of light-emitting-element strings via a wiring, wherein the method comprises: obtaining a wiring IR drop, a light-emitting element string IR drop, a voltage deviation, and a channel IR drop; obtaining a target power supply voltage according to the wiring IR drop, the light-emitting element string IR drop, the voltage deviation, and the channel IR drop; comparing the target power supply voltage with an output voltage to obtain a comparison result; generating an adjustment signal according to the comparison result; and adjusting the output voltage according to the adjustment signal. A driving circuit and a light-emitting substrate are further provided.

18 Claims, 6 Drawing Sheets

(58) Field of Classification Search
CPC ....... H01L 25/0753; H01L 33/62; G09G 3/32; G09G 3/3406
See application file for complete search history.

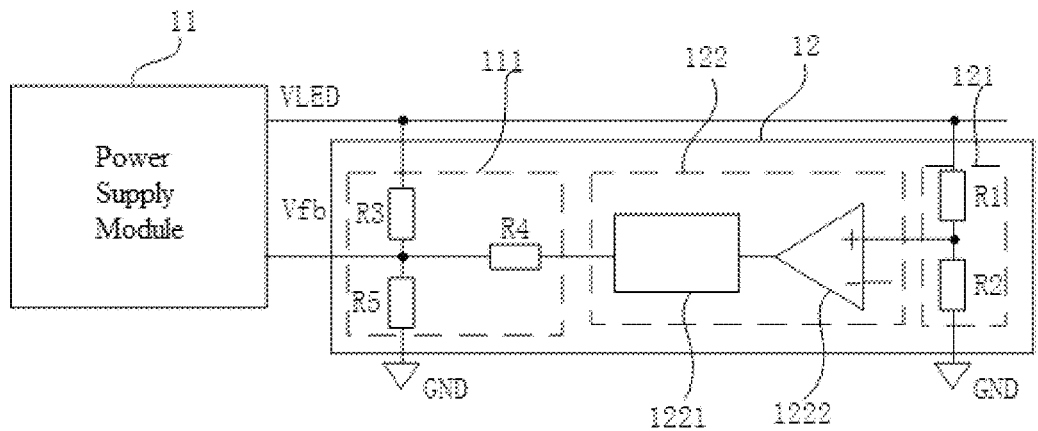

FIG.3

| Obtaining a wiring IR drop of a light-emitting substrate, an IR drop of each of a plurality of light-emitting element strings, a voltage deviation of each of the plurality of light-emitting element strings, and a channel IR drop of each of the plurality of light-emitting element strings | — S10 |

↓

| Determining a target power supply voltage according to the wiring IR drop, the IR drop of each of the plurality of light-emitting element strings, the voltage deviation of each of the plurality of light-emitting element strings, and the channel IR drop of each of the plurality of light-emitting element strings | — S20 |

↓

| Comparing the target power supply voltage and an output voltage | — S30 |

↓

| Generating an adjustment signal according to a comparison result of the output voltage and the target power supply voltage | — S40 |

↓

| Adjusting the output voltage according to the adjustment signal so as to make the output voltage close to or equal to the target power supply voltage | — S50 |

FIG. 4

| Type | Binning Rule | Voltage Range |
|---|---|---|
| 1-Core LED | 0.1V | 5.6~6.1V |
| 2-Core LED | 0.05V | 2.6~2.85V |

FIG. 5

| | |
|---|---|
| Bin1 | 5.6 |
| Bin2 | 5.7 |
| Bin3 | 5.8 |
| Bin4 | 5.9 |
| Bin5 | 6 |
| Bin6 | 6.1 |
| Bin7 | 2.6 |
| Bin8 | 2.65 |
| Bin9 | 2.7 |
| Bin10 | 2.75 |
| Bin11 | 2.8 |
| Bin12 | 2.85 |
| Bin13 | 2.9 |

FIG. 6

METHOD OF CONTROLLING DRIVING CIRCUIT, DRIVING CIRCUIT, AND LIGHT-EMITTING SUBSTRATE

CROSS REFERENCES TO RELATED APPLICATIONS

This disclosure claims the priority of Chinese patent application CN 202011074439.0 entitled "Method of Controlling Driving Circuit, Driving Circuit, and Light-emitting Substrate" and filed with National Intellectual Property Administration, P. R. C. on Oct. 9, 2020, contents of which is incorporated herein by reference in entirety for all purpose.

TECHNICAL FIELD

Embodiments of the present disclosure relate to a method of controlling driving circuit, a driving circuit, and a light-emitting substrate.

BACKGROUND

Mini LED can achieve finer backlight dimming, thereby achieving a better High Dynamic Range (HDR) effect. In related technologies, mini LEDs can be driven through an Active Matrix (AM) backlight driving method. A plurality of small-size driving chips are used to drive corresponding mini LEDs respectively in the AM driving method. Due to the large number of driving chips and a limit by pins of the driving chips, voltages of the mini LEDs cannot be adjusted. Against this, the mini LEDs are provided with a constant voltage, which increases reactive power loss.

SUMMARY

At least one embodiment of the present disclosure provides a method of controlling a driving circuit, the driving circuit being applicable to a light-emitting substrate, the light-emitting substrate including a light-emitting assembly, the light-emitting assembly including a plurality of light-emitting element strings connected in parallel, each of the plurality of light-emitting strings including a plurality of light-emitting elements connected in series, the driving circuit connected to the plurality of light-emitting element strings via a wiring, wherein the method includes:

obtaining a wiring IR drop of the light-emitting substrate, a light-emitting element string IR drop of each of the plurality of light-emitting element strings, a voltage deviation of each of the plurality of light-emitting element strings, and a channel IR drop of each of the plurality of light-emitting element strings;

obtaining a target power supply voltage according to the wiring IR drop, the light-emitting element string IR drop of each of the plurality of light-emitting element strings, the voltage deviation of each of the plurality of light-emitting element strings, and the channel IR drop of each of the plurality of light-emitting element strings;

comparing the target power supply voltage with an output voltage supplied to the light-emitting assembly; generating an adjustment signal according to a comparison result of the output voltage and the target power supply voltage; and adjusting the output voltage according to the adjustment signal; so that the output voltage is close to or equal to the target power supply voltage.

in some embodiments of the present disclosure, obtaining the wiring IR drop of the light-emitting substrate, the light-emitting element string IR drop of each of the plurality of light-emitting element strings, the voltage deviation of each of the plurality of light-emitting element strings, and the channel IR drop of each of the plurality of light-emitting element strings includes:

obtaining a temperature of the light-emitting substrate and a preset voltage of the light-emitting element string;

determining a temperature-related voltage deviation of the light-emitting element string according to the temperature of the light-emitting substrate; and obtaining the light-emitting element string IR drop according to the temperature-related voltage deviation of the light-emitting element string and the preset voltage.

In some embodiments of the present disclosure; obtaining the wiring IR drop of the light-emitting substrate, the light-emitting element string IR drop of each of the plurality of light-emitting element strings, the voltage deviation of each of the plurality of light-emitting element strings, and the channel IR drop of each of the plurality of light-emitting element strings includes:

obtaining the number of the light-emitting elements of each of the plurality of the light-emitting element strings and binning information of each of the plurality of light-emitting element strings; and obtaining the voltage deviation of the light-emitting element string according to the number of the light-emitting elements and the binning information.

In some embodiments of the present disclosure, obtaining the wiring IR drop of the light-emitting substrate, the light-emitting element string IR drop of each of the plurality of light-emitting element strings, the voltage deviation of each of the plurality of light-emitting element strings, and the channel IR drop of each of the plurality of light-emitting element strings includes:

obtaining a preset resistance of a power supply line and a preset current of a power supply line in the light-emitting substrate; and obtaining the wiring IR drop according to the preset resistance and the preset current.

In some embodiments of the present disclosure, generating the adjustment signal according to the comparison result of the output voltage and the power target supply voltage comprises at least one of following:

generating a first adjustment signal in a case that the target power supply voltage is greater than the output voltage; and generating a second adjustment signal in a case that the target power supply voltage is less than the output voltage.

At least one embodiment of the present disclosure provides a driving circuit configured to drive a light-emitting assembly of a light-emitting substrate, the light-emitting assembly including a plurality of light-emitting element strings connected in parallel, and each of the plurality of light-emitting strings including a plurality of light-emitting elements connected in series, the driving circuit connected to the plurality of light-emitting element strings through a wiring, wherein the driving circuit includes a power supply module, a Tx chip, and a driving chip, and the power supply module is connected to the Tx chip and the driving chip respectively, and the driving chip is further connected to the light-emitting assembly; wherein, the power supply module is configured to output an output voltage to the light-emitting assembly;

the driving chip is configured to drive the light-emitting assembly to emit light; and The Tx chip is configured to:
obtain a wiring IR drop, a light-emitting element string IR drop of each of the plurality of light-emitting element strings, a voltage deviation of each of the plurality of light-emitting element strings, and a channel IR drop of each of the plurality of light-emitting element strings;
obtain a target power supply voltage according to the wiring IR drop, the light-emitting element string IR drop of each of the plurality of light-emitting element strings, the voltage deviation of each of the plurality of light-emitting element strings, and the channel IR drop of each of the plurality of light-emitting element strings;
compare the target power supply voltage and an output voltage;
generate an adjustment signal according to a comparison result of the target power supply voltage and the output voltage; and
adjust the output voltage according to the adjustment signal, so that the output voltage is close to or equal to the target power supply voltage.

In some embodiments of the present disclosure, the driving circuit further includes a temperature sensor connected to the Tx chip, and the temperature sensor is configured to obtain a temperature of the light-emitting substrate.

In some embodiments of the present disclosure, the drive circuit further includes a voltage detecting circuit, the voltage detecting circuit is respectively connected to the power supply module and the Tx chip, and the voltage detecting circuit is configured to detect the output voltage of the power supply module.

In some embodiments of the present disclosure, the voltage detecting circuit includes a first resistor and a second resistor, a first end of the first circuit is connected to an output end of the power supply module, and a second end of the first resistor is connected to the Tx chip to send detected output voltage to the Tx chip, a first end of the second resistor is connected to the second end of the first resistor, and a second end of the second resistor is grounded.

In some embodiments of the present disclosure, the first resistor and the second resistor are fixed resistances, which do not vary with temperature.

In some embodiments of the present disclosure, the Tx chip includes a comparing circuit connected to the voltage detecting circuit, and the comparing circuit is configured to compare the output voltage with the target power supply voltage and to generate an adjustment signal.

In some embodiments of the present disclosure, the comparing circuit includes a signal output element and a comparing element, wherein the comparing element includes a first end connected to the second end of the first resistor, a second end connected to the target power supply voltage, and an output end connected to the comparing element.

In some embodiments of the present disclosure, the Tx chip further includes a voltage adjusting circuit, the voltage adjusting circuit is connected to the comparing circuit and is configured to adjust the output voltage according to the adjustment signal.

In some embodiments of the present disclosure, the voltage adjusting circuit includes a third resistor, a fourth resistor, and a fifth resistor, wherein a first end of the third resistor, a first end of the fourth resistor, and a first end of the fifth resistor are connected to an voltage adjusting end of the power supply module, and a second end of the third resistor is connected to the output end of the power supply module, a second end of the fourth resistor is connected to the signal output element, and a second end of the fifth resistor is grounded.

In some embodiments of the present disclosure, the third resistor, the fourth resistor, and the fifth resistor are fixed resistances which do not vary with temperature.

At least one embodiment of the present disclosure provides a light-emitting substrate, including light-emitting assembly and the driving circuit as described above, the driving circuit is configured to drive the light-emitting assembly.

The additional aspects and advantages of the present disclosure will be partially given in the following description, and some will become obvious from the following description, or be understood through the practice of the present disclosure.

BRIEF DESCRIPTION OF THE DRAWINGS

The above and/or additional aspects and advantages of the present disclosure will become obvious and easy to understand from the description of the embodiments in conjunction with the following drawings, in which:

FIG. 3 illustrates a schematic view of a connection between a power supply module and a Tx chip according to an embodiment of the present disclosure.

FIG. 4 illustrates a schematic flowchart of a method of controlling a driving circuit according to an embodiment of the present disclosure.

FIG. 5 illustrates a schematic view of a classification standard of light-emitting elements according to an embodiment of the present disclosure FIG. 6 illustrates a schematic view of classification of light-emitting elements according to an embodiment of the present disclosure.

Figure 1:
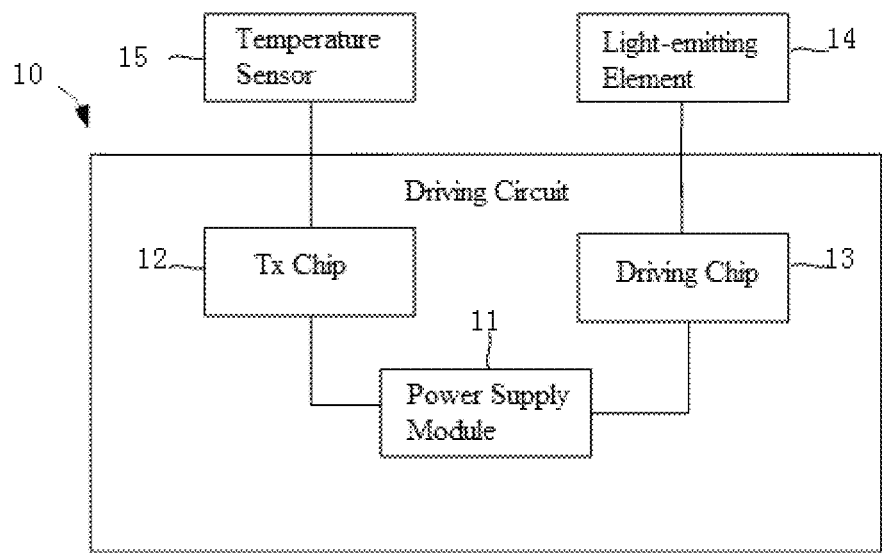
FIG. 1 illustrates a block diagram of a driving circuit according to an embodiment of the present disclosure.

Description of reference signs of main components:
Driving Circuit 10
Power supply Module 11
Voltage Adjusting Circuit 111
Third Resistor R3
Fourth Resistor R4
Fifth Resistor R5
Tx Chip 12

Voltage detecting circuit 121
First Resistor R1
Second Resistor R2
Comparing circuit 122
Signal Output Element 1221
Comparing Element 1222
Driving Chip 13
Light-emitting Element 14
Temperature Sensor 15
Output Voltage VLED
Target power Supply Voltage Vref
Light-emitting Substrate 100
Substrate 110

DETAILED DESCRIPTION OF THE EMBODIMENTS

The embodiments of the present disclosure will be described in detail hereinafter. Examples of the embodiments are illustrated in the accompanying drawings, in which the same or similar reference numerals designate the same or similar elements or elements with the same or similar functions. The following embodiments described with reference to the accompanying drawings are exemplary, and are only intended to explain the present disclosure, and cannot be construed as a limn to the present disclosure.

In the description of the present disclosure, it should be understood that orientation or positional relationship indicated by the terms "center", "longitudinal", "crosswise", "length", "width", "thickness", "upper", "lower", "front", ""back", "left", "right". "vertical", "horizontal", "top", "bottom", "inner", "outer", "clockwise", "counterclockwise" and the like is based on the orientation or positional relationship illustrated in the drawings, which is only for the convenience of describing the present disclosure and simplifying the description, and do not indicate or imply that the referred device or element must configured or operated with a specific orientation or in a specific positional relationship, and cannot be construed as a limit to the present disclosure. In addition, the terms "first" and "second" are only used for descriptive purposes, and cannot be understood as indicating or implying relative importance or implicitly indicating the number of indicated technical features. Therefore, the features defined with "first" and "second" may explicitly or implicitly include one or more of the features. In the description of the present disclosure, "plurality" means two or more than two, unless specifically defined otherwise.

In the description of the present disclosure, it should be noted that, unless otherwise clearly defined and defined, the terms "coupled", "connected", and "linked" should be understood in a broad sense, for example, it may be fixedly connected or may be detachable connection, or integral connections; it can be mechanical connection, it can be electrical connection or it can be a communication with each other; it can be direct connection or indirect connection through an intermediate medium, it can be internal communication of two components or a mutual action of two components. One of ordinary skill in the art can understand the specific meaning of the above-mentioned terms in the present disclosure according to specific circumstances.

In the present disclosure, unless expressly limited and defined otherwise, the first feature "on" or "under" the second feature may include direct contact between the first feature and the second feature, or may include indirect contact of the first feature and the second feature through another feature between them. Moreover, the first feature "above", "over" and "on" the second feature include the first feature being directly above and obliquely above the second feature, or simply means that a level of the first feature is higher than that of the second feature. The first feature "below", "under" and "beneath" the second feature include the first feature directly below and obliquely below the second feature, or simply means that a level of the first feature is lower than that of the second feature.

The following disclosure provides many different embodiments or examples for implementing different structures of the present disclosure. In order to simplify the disclosure of the present disclosure, components and configurations of specific examples are described hereinafter. Of course, they are only exemplary examples, and are not intended to limit the present disclosure. In addition, reference signs and/or reference letters may be repeated in different examples of the present disclosure, and this repetition is for the purpose of simplification and clarity, and does not indicate a relationship between the various embodiments and/or configurations discussed. In addition, the present disclosure provides examples of various specific processes and materials, but one of ordinary skill in the art may be aware of the application of other processes and/or the use of other materials.

Mini LED refers to an LED chip with a size on an order of 100 μm. The size is between a small-pitch LED and a micro LED. It is a product of further reduction in the size of the small-pitch LED. The small-pitch LEDs refer to an LED backlight source or a display product with a distance between adjacent LEDs less than 2.5 mm. The mini LED can achieve finer backlight dimming, thereby achieving a better High Dynamic Range (HDR) effect. At the same time, it has a faster response, higher high temperature reliability, and has a same long lifespan as a TFT LCD.

In the technology known to the inventors, the Mini LED may be driven through an Active Matrix (AM) backlight driving manner. The AM backlight driving manner refers to that, in the active addressing driving circuit, each Mini-LED is driven by a corresponding individual driving circuit its corresponding Independent drive circuit, and a driving voltage is provided by a driving chip. Multiple small-size driver chips are typically configured to drive the corresponding mini LEDs respectively in the AM backlight driving method. However, due to the large number of driver chips and the limitation of the driver chip pins, the supply voltage VLED cannot be adjusted, and the mini LED is provided a constant voltage as power supply VLED, which increases reactive power loss.

Please refer to FIG. 1, in view of this, embodiments of the present disclosure provides a driving circuit 10 applicable to a light-emitting substrate 100, the light-emitting substrate 100 includes a lighting assembly 14, and the driving circuit 10 is configured to drive the lighting assembly 14. The driving circuit 10 includes a power supply module 11, a Tx chip 12 and a driving chip 13. The power supply module 11 is electrically connected to the Tx chip 12 and the driving chip 13 respectively, and the driving chip 13 is electrically connected to the lighting assembly 14.

The light-emitting substrate 100 may be applied to any product or component with a display function, such as a mobile phone, a tablet computer, a television, a display, a notebook computer, a digital photo frame, a navigator, and the like.

The light-emitting substrate 100 further includes a substrate 110, and the light-emitting assembly 14 and the driving circuit 10 are disposed on the substrate 110. The light-emitting assembly 14 includes a plurality of light-emitting element strings which are connected in parallel, and each of the plurality of light-emitting element strings includes a plurality of light-emitting elements connected in series. The light-emitting element may be a mini LED. The light-emitting substrate includes a plurality of the driving chips 13, each of which is connected to a light-emitting element string correspondingly. Each of the plurality of driving chips 13 is configured to drive a corresponding light-emitting element string to emit light.

Figure 2:
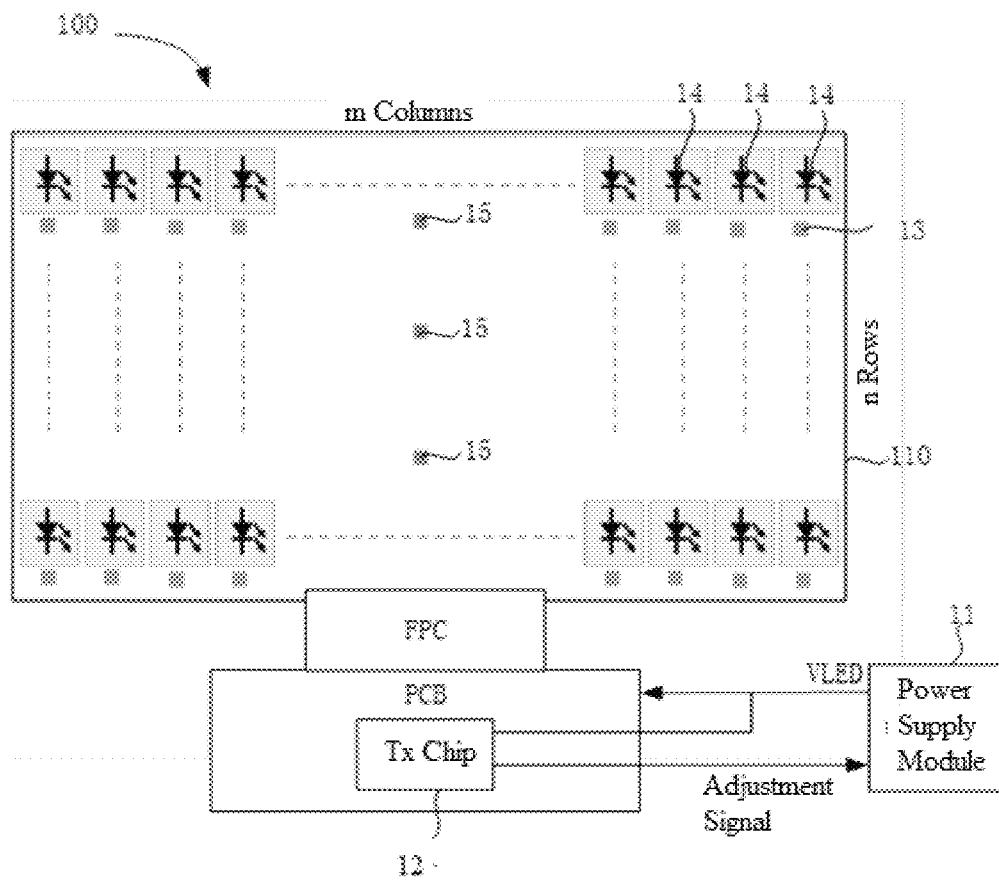
FIG. 2 illustrates a schematic diagram of a module of a light-emitting substrate according to an embodiment of the present disclosure.

Referring to FIG. 2, further, the light-emitting substrate 100 further includes a flexible printed circuit (FPC) and a printed circuit board (PCB) adhered to the flexible circuit board. The FPC is electrically connected to the driving chip 13 and the power supply module 11 respectively so as to achieve electrical connection between the power supply module 11 and the driving chip 13. The power supply module 11 may be a DC-DC power supply module or an AC-DC power supply module. The power supply module 11 outputs an output voltage \TED to the PCB board, so that the driving chip 13 can drive the light-emitting element string to emit light.

One of ordinary skill in the art can understand that the FPC is a highly reliable and excellent flexible printed circuit board with a polyimide or polyester film as a substrate, and has features of high wiring density, light weight, small thickness and good bendability. PCB is an important electronic component, supports electronic components, and carries electrical connection of electronic components. Because it is made by electronic printing, it is called a "printed" circuit board.

The Tx chip 12 is disposed on the PCB circuit board, is electrically connected to the power supply module 11 and the FPC respectively. The Tx chip 12 is configured to adjust the output voltage \LED output by the power supply module 11.

Please refer to FIGS. 1 and 2 together. In some embodiments of the present disclosure, the light-emitting substrate further includes a temperature sensor 15 configured to obtain a temperature of the light-emitting substrate 100.

The light-emitting substrate 100 includes a plurality of the temperature sensors 15, and the plurality of temperature sensors 15 are disposed on the substrate 110 and configured to detect the temperature of the substrate 110. The temperature sensor 15 can be electrically connected to the driving chip 13 so as to be electrically connected to the Tx chip 12, or directly electrically connected to the Tx chip 12, thus the temperature sensor 15 can send the obtained temperature to the Tx chip 12, so that the Tx chip 12 can adjust the output voltage VLED output by the power supply module 11 according to the temperature obtained by the temperature sensor 15.

Please refer to FIG. 3, in some embodiments of the present disclosure, the Tx chip 12 includes a voltage detecting circuit 121. The voltage detecting circuit 121 is respectively connected to the power supply module 11 and the Tx chip 12. The voltage detecting circuit 121 is configured to detect the output voltage VLED currently output by the power supply module 11.

In some embodiments of the present disclosure, the voltage detecting circuit 121 includes a first resistor R1 and a second resistor R2. A first end of the first resistor R1 is connected to an output end of the power supply module 11, a second end of the first resistor R1 is connected to the Tx chip 12 to output a detected output voltage VLED to the Tx chip 12, a first end of the second resistor R2 is connected to the second end of the first resistor, and a second end of the second resistor R2 is grounded. It should be noted that the first resistance R1 and the second resistance R2 have a fixed resistance, that is, the first resistance R1 and the second resistance R2 do not vary with temperature changes. Of course, the first resistor R1 and the second resistor R2 can further be same resistors, that is, their resistance vary with temperature in a same manner. In this way, in operation, the detection result of the voltage detecting circuit 121 will not be affected by change of the temperature.

In some embodiments of the present disclosure, the Tx chip 12 further includes a comparing circuit 122 connected to the voltage detecting circuit 121, and the comparing circuit 122 is configured to compare the output voltage VLED with a target power supply voltage Vref so as to generate an adjustment signal.

It should be noted that the target power supply voltage Vref refers to a voltage that is actually required by the light-emitting substrate 100. The output voltage VLED refers to a voltage currently output by the power supply module 11 to the light-emitting substrate 100.

In some embodiments of the present disclosure, the comparing circuit 122 includes a signal output sub-circuit 1221 and a comparing sub-circuit 1222, wherein a first end of the comparing sub-circuit 1222 is connected to the second end of the first resistor R1, and a second end of the comparing sub-circuit 1222 is connected to the target supply voltage Vref, and an output end of the comparing sub-circuit 1222 is connected to the signal output sub-circuit 1221. The comparing circuit 1222 can compare the output voltage VLED input at the first end and the target power supply voltage Vref input at the second end, so that the signal output sub-circuit 1221 can generate an adjustment signal according to a comparison result of the output voltage VLED and the target power supply voltage Vref. The adjustment signal may be a voltage signal or a current signal, which is not limited in the present disclosure. In some embodiments of the present disclosure, the adjustment signal may be a current signal.

Please refer to FIG. 3 again, in some embodiments of the present disclosure, the Tx chip 12 further includes a voltage adjusting circuit 111. The voltage adjusting circuit 111 is connected to the comparing circuit 122, the voltage adjusting circuit 111 is configured to adjust the output voltage VLED output by the power supply module 11 according to the adjustment signal generated by the Tx chip 12.

In some embodiments of the present disclosure, the power supply module 11 further includes a voltage output end and a voltage adjustment end, the voltage Output end is configured to output the output voltage VLED, and the voltage adjustment end is configured to output an adjustment voltage Vfb. It should be noted that the regulation voltage Vfb is a fixed voltage, for example, the regulation voltage Vfb may be 3V. The voltage adjusting circuit 111 includes a third resistor R3, a fourth resistor R4, and a fifth resistor R5. A first end of the third resistor R3, a first end of the fourth resistor R4, and a first end of the fifth resistor R5 are all connected to the voltage adjustment end, and a second end of the third resistor R3 is connected to the output end of the power supply module, a second end of the fourth resistor R4 is connected to a second end of the signal output element 1221, and a second end of the fifth resistor R5 is grounded.

In some embodiments of the present disclosure, the resistance values of the third resistor R3, the fourth resistor R4, and the fifth resistor R5 are fixed values, and the adjustment signal may be a current signal, that is, the signal output element 1221 can output a current to the fourth resistor R4. It can be understood that since the resistance values of the third resistor R3; the fourth resistor R4; and the fifth resistor R5 remain unchanged, and the voltage at the first end of the third resistor R3, the first end of the fourth resistor R4, and the first end of the fifth resistor R5 is the adjustment voltage Vfb, if the current signal output by the signal output element 1221 is changed, for example, the current signal increases or decreases, the output voltage VlED at the second end of the third resistor R3 also changes. In this way, adjustment of the output voltage VLED by the Tx chip 12 can be achieved, and the driving voltage provided by the driving chip 13 to the light-emitting element string can be changed, thereby avoiding reactive power consumption.

Referring to FIG. 4, at least one embodiment of the present disclosure further provides a method of controlling the driving circuit 100, including:

S10: a wiring IR drop of a light-emitting substrate, an IR drop of each of a plurality of light-emitting element strings, a voltage deviation of each of the plurality of light-emitting element strings, and a channel IR drop of each of the plurality of light-emitting element strings are obtained;

S20: a target power supply voltage is determined according to the wiring IR drop, the IR drop of each of the plurality of light-emitting element strings, the voltage deviation of each of the plurality of light-emitting element strings, and the channel IR drop of each of the plurality of light-emitting element strings; and S30: the target power supply voltage and an output voltage are compared;

S40, an adjustment signal is generated according to a comparison result of the output voltage and the target power supply voltage; and S50: the output voltage is adjusted according to the adjustment signal so as to make the output voltage close to or equal to the target power supply voltage.

In some embodiments of the present disclosure, the method according to the present disclosure can be implemented by the Tx chip 12 as described above, that is, the Tx chip 12 can be configured to obtain the wiring IR drop of the light-emitting substrate 100, the IR drop of each of the plurality of light-emitting element strings, the voltage deviation of each of the plurality of light-emitting element strings, and the channel IR drop of each of the plurality of light-emitting element strings; obtain the target power supply voltage according to the wiring IR drop, the IR drop of each of the plurality of light-emitting element strings, the voltage deviation of each of the plurality of light-emitting element strings, and the channel IR drop of each of the plurality of light-emitting element strings, and the Tx chip 12 may be further configured to compare the target power supply voltage and the output voltage and generate an adjustment signal according to a comparison between the output voltage and the target power supply voltage.

It should be noted that the wiring IR drop of the light-emitting substrate 100 refers to a voltage loss when the output voltage is output from the output end of the power supply module 11 and flows through the FPC board, the PCB board, the driving chip and other circuits or electronic components of the light-emitting substrate 100. Usually the wiring drop is a fixed value. It can be understood that the circuits or electronic components of the light-emitting substrate 100 have resistance, and therefore, they divide a part of the output voltage.

The channel IR drop refers to a minimum voltage value or a critical voltage value required to drive a light-emitting element to emit light. The channel IR drop is a fixed value. For example, the channel IR drop can be 0.3V or 0.4V, which is an inherent property of the light-emitting element.

Please to FIGS. 5 and 6, the voltage deviation of a light-emitting element string refers to a sum of respective voltage deviations of each light-emitting element string contained in a light-emitting element string, and the voltage deviation of light-emitting element string is a fixed value. It can be understood that during encapsulating process of the light-emitting assembly 14, due to the huge number of light-emitting elements contained therein, it cannot be guaranteed that the light-emitting elements produced at the same time are at the same voltage, current, and have a same luminous flux output. Therefore, it is necessary to classify each light-emitting element by a binning voltage or a binning current, so that light-emitting elements 14 with similar voltage, current and luminous flux output are grouped together to form a light-emitting element string. Wherein, a voltage deviation between the light-emitting elements of the light-emitting element string is less than or equal to the binning voltage. In some embodiments of the present disclosure, the binning voltage may be 0.1V or 0.05V, that is, in a case that the light-emitting element of the light-emitting element string is a single-core LED, the binning voltage is 0.05V and in case that the light-emitting element of the light-emitting element string is a dual-core LEI), the binning voltage is 0.1V. For example, in some embodiments of the present disclosure, the light-emitting element of the light-emitting substrate 100 is a single-core LED with a voltage range of 2.6 V to 2.85V, light-emitting elements with voltages of 2.6V to 2.65V are classified into a category, light-emitting elements with voltages of 2.65 V to 2.7V are classified into a category, light-emitting elements with voltages of 2.7V to 2.75V are classified into a category, and light-emitting elements with voltages of 2.75V to 2.8 V are classified into a category, and light-emitting elements with a voltage of 2.8V to 2.85V are classified into a category. The light-emitting element string IR drop refers to a voltage required to drive the light-emitting element string to emit light properly.

Referring to FIG. 2, in the method of controlling the driving circuit according to the embodiment of the present disclosure, a target power supply voltage required by the light-emitting substrate 100 is obtained by obtaining the wiring IR drop of the light-emitting substrate 100, the IR drop of each of the plurality of light-emitting element strings, the voltage deviation of each of the plurality of light-emitting element strings, and the channel IR drop of each of the plurality of light-emitting element strings, and then the target power supply voltage is compared with the output voltage currently output by the power supply module 11, a difference between the output voltage and the target power supply voltage is determined, And an adjustment signal is generated in a case that there is a difference between the output voltage and the target power supply voltage so as to adjust the output voltage, such that the difference between the output voltage and the target power supply voltage decreases. Thus, the power supply module 11 can provide a voltage required by the light-emitting substrate 100, thereby guaranteeing that the light-emitting substrate 100 displays properly, and reducing the power consumption of the backlight.

In some embodiments of the present disclosure, the Tx chip 12 further includes a processor and a memory communicating with the processor, where the memory can be configured to store data related to the channel IR drop, the light-emitting element string IR drop, the voltage deviation of light-emitting element string, and the wiring IR drop and the like. The processor can accumulate the channel IR drop, the light-emitting element string IR drop, the voltage deviation of light-emitting element string, and the wiring IR drop obtained from the memory to obtain the target power supply voltage.

In some embodiments of the present disclosure, the processor is further connected to a second end of the comparing sub-circuit to provide the target power supply voltage to the comparing sub-circuit, so that the Tx chip 12 can compare the target power supply voltage obtained by the processor with the current output voltage, and generate an adjustment signal and send the adjustment signal to the voltage adjusting circuit 111. Furthermore, the voltage adjusting circuit can adjust the output voltage currently output by the power supply module 11 so that the output voltage can be close to or equal to the target supply voltage.

Figure 7:
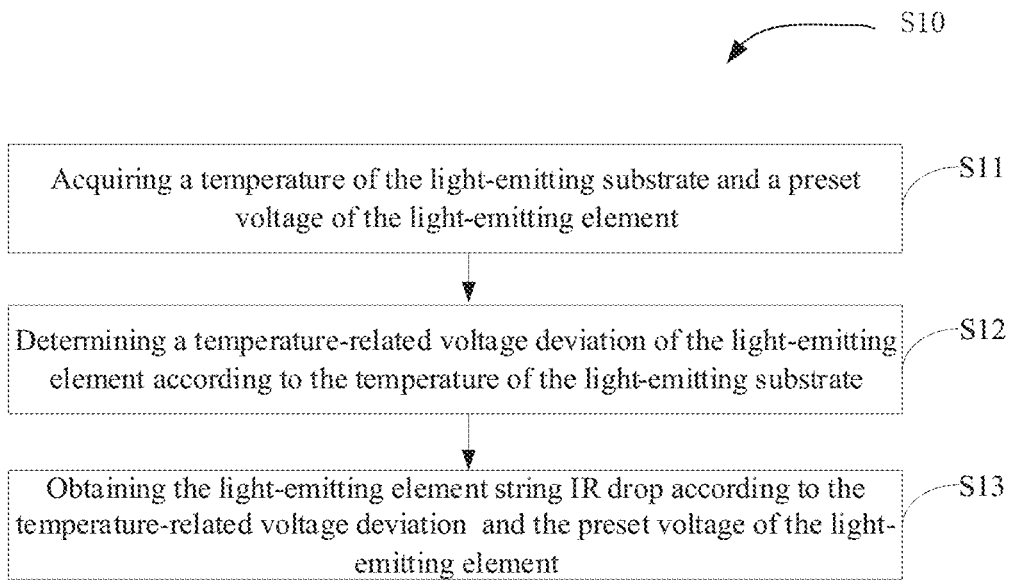
FIG. 7 illustrates a schematic flowchart of a method of controlling a driving circuit according to an embodiment of the present disclosure.

Referring to FIG. 7, in some embodiments of the present disclosure, step S10 includes:

S11, acquiring a temperature of the light-emitting substrate and a preset voltage of the light-emitting element;

S12, determining a temperature-related voltage deviation of the light-emitting element according to the temperature of the light-emitting substrate; and S13: obtaining the light-emitting element string IR drop according to the temperature-related voltage deviation of the light-emitting element and the preset voltage of the light-emitting element.

Please refer to FIG. 7, it should be noted that the memory stores a mapping correspondence between a temperature and the temperature-related voltage deviation of the light-emitting element and the preset voltage of the light-emitting element. It can be understood that the driving voltage required by the light-emitting element varies with the temperature. Therefore, in order to obtain an accurate voltage required by the light-emitting element string at a current temperature, the processor is connected to the temperature sensor 15 to obtain the temperature detected by the temperature sensor 15 so as to determine the temperature-related voltage deviation of the light-emitting element, and obtain a voltage required by each light-emitting element by accumulating the temperature-related voltage deviation and the preset voltage of the light-emitting element. And furthermore, the processor accumulates the voltages required by respective light-emitting element of a light-emitting element string so as to obtain a light-emitting element string IR drop.

It should also be noted that since there are a plurality of temperature sensors 15, in the embodiment of the present disclosure, the processor obtains a corresponding temperature-related voltage deviation according to the highest temperature obtained.

Figure 8:
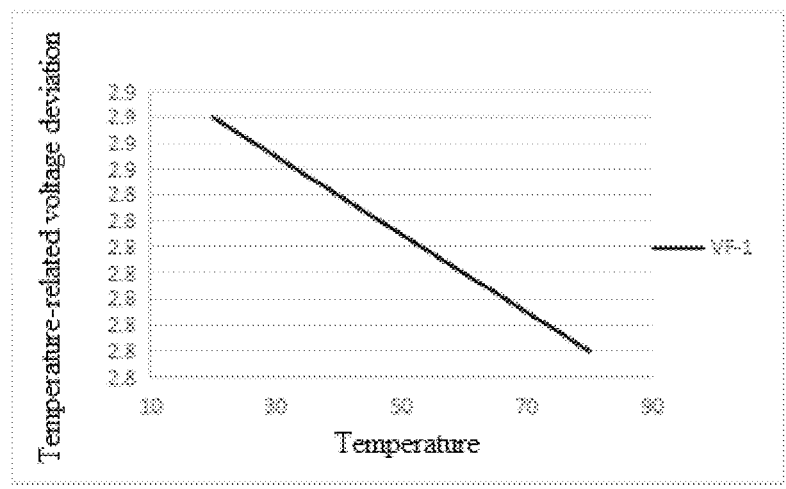
FIG. 8 illustrates a schematic view of a mapping relationship between temperature and voltage variation related to temperature according to an embodiment of the present disclosure.
Figure 9:
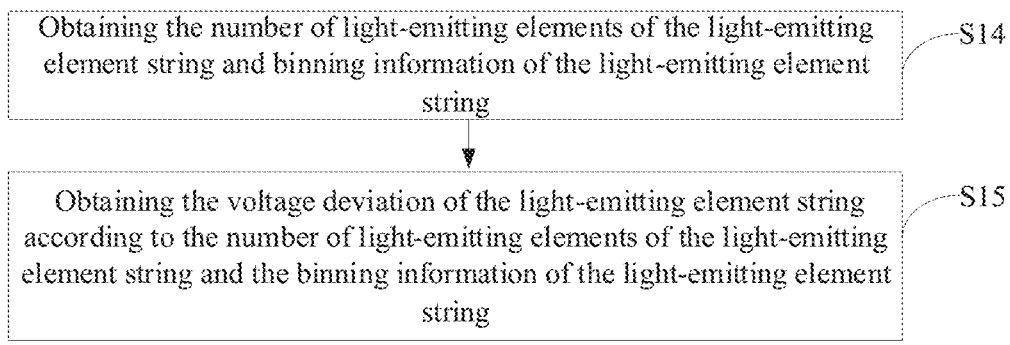
FIG. 9 illustrates a schematic flowchart of a method of controlling a driving circuit according to another embodiment of the present disclosure.

In some embodiments of the present disclosure, as illustrated in FIG. 8, step S10 further includes:

S14: obtaining the number of light-emitting elements of the light-emitting element string and binning information of the light-emitting element string; and S15: obtaining the voltage deviation of the light-emitting element string according to the number of light-emitting elements of the light-emitting element string and the binning information of the light-emitting element string.

In some embodiments of the present disclosure, as illustrated in FIGS. 5 and 6, the memory stores binning information of light-emitting element strings and data of respective light-emitting elements of the light-emitting element strings. The binning information refers to a standard for classifying the light-emitting elements 14 of the light-emitting substrate 100. In the embodiment of the present disclosure, the binning information is a binning voltage, and the light-emitting elements 14 can be classified according to the binning information so as to form a plurality of light-emitting element string. The processor may obtain the voltage deviation of the light-emitting element string according to the number of light-emitting elements 14 of the light-emitting element string and the binning information of the light-emitting element string, where the voltage deviation of the light-emitting element string is a product of the number of light-emitting elements of the light-emitting element string and the binning voltage.

Figure 10:
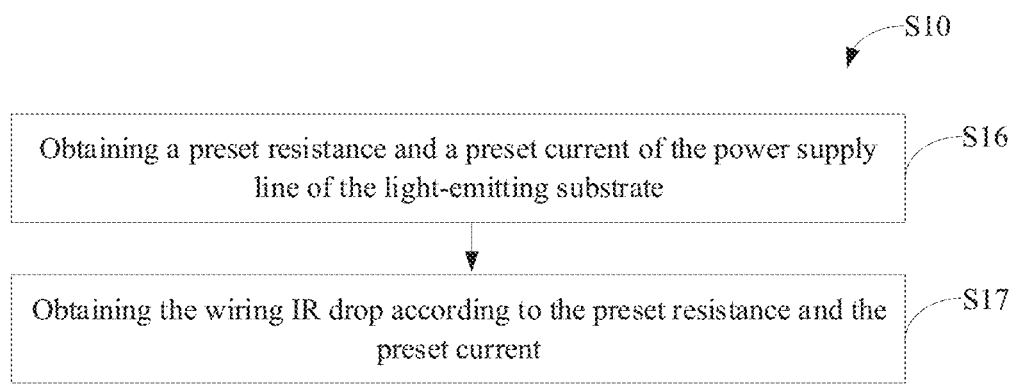
FIG. 10 illustrates a schematic flowchart of a method of controlling a driving circuit according to still another embodiment of the present disclosure.

In some embodiments of the present disclosure, as illustrated in FIG. 10, step S10 includes sub-steps:

S16, obtaining a preset resistance and a preset current of the power supply line of the light-emitting substrate; and S17: obtaining the wiring IR drop according to the preset resistance and the preset current.

Figure 11:
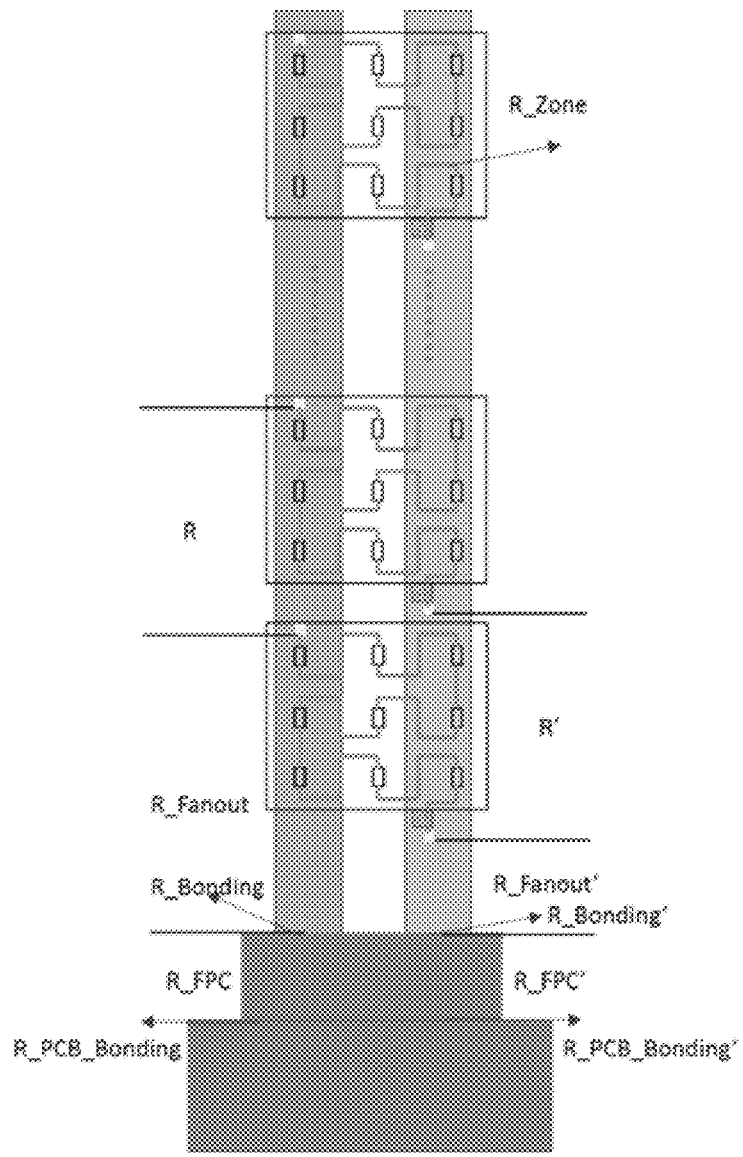
FIG. 11 illustrates a schematic view of a wiring layout of a light-emitting substrate according to one of the present disclosure.

It should be noted that, as illustrated in FIG. 11, the preset resistance of the power supply line of the light-emitting substrate refers to the resistance of all wirings and electronic components of the light-emitting assembly 14. The preset resistance is a fixed value, that is, the resistance values of all wirings and electronic components of the light-emitting assembly 14 do not vary. The preset current refers to a current value flowing through all the wirings and electronic components of the light-emitting assembly 14 when the power supply module 11 supplies power to the light-emitting assembly 14. The preset resistance and the preset current are stored in the memory, and the preset resistance includes FPC board wiring resistance, substrate wiring resistance, bonding resistance, etc. The preset current includes n local currents, namely I1, I2, I3 . . . In, and the n local currents are divided according to the arrangement of the light-emitting element strings. The processor can calculate the wiring IR drop according to the preset resistance and the preset current.

A equation for calculating the wiring IR drop V_IRdrop is:

$$V\_IRdrop = V\_IRdrop\_VLED + V\_IRdrop\_GND + \max\{I1*R\_Zone, I2*R\_Zone, \ldots, In*R\_Zone\}.$$

Where, V_IRdrop_VLED indicates a wiring IR drop at an anode end of the light-emitting element string, V_IRdrop_GND indicates a wiring IR drop at a grounded cathode end of the light-emitting element string, and R_Zone indicates a wiring resistance of the light-emitting element string.

The equation for calculating the wiring IR drop V_IRdrop_VLED at the anode end of the light-emitting element string is:

$$V\_IRdrop\_VLED = (I1+I2+\ldots+In)*(R\_PCB\_Bonding+R\_FPC+R\_Bonding+R\_Fanout)+(I2+I3+\ldots+In)*R+(I3+I4+\ldots+In)*R+\ldots+in*R.$$

Where, R_PCB_Bonding indicates a bonding resistance on a side of the PCB board connected to the output voltage, R_FPC indicates a resistance on a side of the FPC board connected to the output voltage, R_Fanout indicates a resistance on a side of the output end connected to the output voltage, and R indicates a resistance on a side of the light-emitting element string connected to the output voltage.

The equation for calculating the IR drop from an cathode of the light-emitting element string to the ground is:

$$V\_IRdrop\_GND = (I2+I3+\ldots In)*R\_PCB\_Bonding' + R\_FPC'+R\_Bonding'+R\_Fanout')+(I2+I3+\ldots+In)*R'+(I3+I4+\ldots+In)*R'+\ldots+in*R'.$$

Where. R_PCB_Bonding' indicates a bonding resistance on a side of the PCB board connected to the ground, R_FPC' indicates a resistance on a side of the FPC board connected to the ground, R_Fanout' indicates a resistance on a side of the output end connected to the ground, R' indicates a resistance on a side of the light-emitting element connected to the ground.

Figure 12:
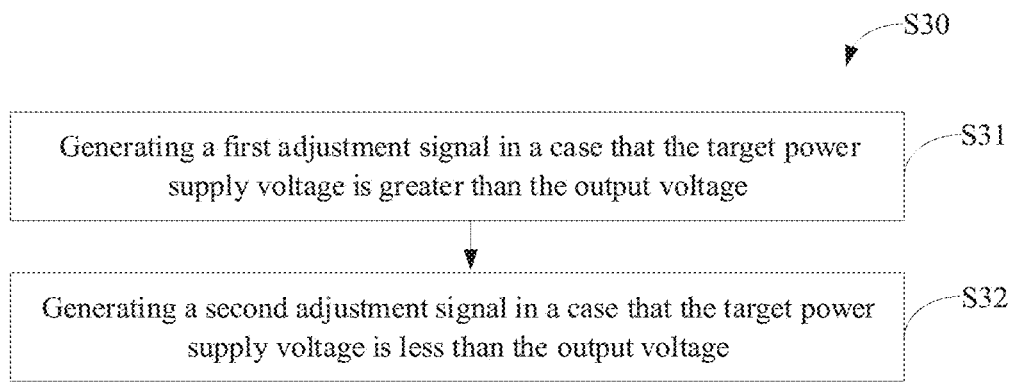
FIG. 12 illustrates a schematic flowchart of a method of controlling a driving circuit according to another embodiment of the present disclosure.

In some embodiments of the present disclosure, as illustrated in FIG. 12, step S30 includes:

S31, generating a first adjustment signal in a case that the target power supply voltage is greater than the output voltage; and S32: generating a second adjustment signal in a case that the target power supply, voltage is less than the output voltage.

In some embodiments of the present disclosure, the first adjustment signal is configured to increase the output voltage so that the output voltage is close to or equal to the target power supply voltage. The second adjustment signal is configured to decrease the output voltage so that the output voltage is close to or equal to the target power supply voltage. In this way, in a case that the voltage regulating circuit receives the first adjustment signal, it can increase the output voltage of the power supply output end, and in a case that the voltage regulating circuit receives the second adjustment signal, it can decrease the output voltage of the power supply output end.

In the description of this specification, the description with reference to the terms "an embodiment", "some embodiments", "exemplary embodiments", "examples", "specific examples", or "some examples", etc. means that the specific features, structures, materials or characteristics described in junction with the described embodiments or examples are included in at least one embodiment or example of the present disclosure. In this specification, the schematic representation of the above-mentioned terms does not necessarily refer to the same embodiment or example. Moreover, the described specific features, structures, materials or characteristics can be combined in any one or more embodiments or examples in an appropriate manner.

Although the embodiments of the present disclosure have been illustrated and described, one of ordinary skill in the art can understand that various changes, modifications, substitutions, and variants can be made to these embodiments without departing from the principle and purpose of the present disclosure. The scope of the present disclosure is defined by the appended claims and their equivalents.

The invention claimed is:

1. A method of controlling a driving circuit, the driving circuit being applicable to a light-emitting substrate, the light-emitting substrate comprising a light-emitting assembly, the light-emitting assembly comprising a plurality of light-emitting element strings connected in parallel, each of the plurality of light-emitting strings comprising a plurality of light-emitting elements connected in series, the driving circuit connected to the plurality of light-emitting element strings via a wiring, wherein the method comprises:
   obtaining a wiring IR drop of the light-emitting substrate, a light-emitting element string IR drop of each of the plurality of light-emitting element strings, a voltage deviation of each of the plurality of light-emitting element strings, and a channel IR drop of each of the plurality of light-emitting element strings;
   obtaining a target power supply voltage according to the wiring IR drop, the light-emitting element string IR drop of each of the plurality of light-emitting element strings, the voltage deviation of each of the plurality of light-emitting element strings, and the channel IR drop of each of the plurality of light-emitting element strings;
   comparing the target power supply voltage with an output voltage supplied to the light-emitting assembly;
   generating an adjustment signal according to a comparison result of the output voltage and the target power supply voltage; and
   adjusting the output voltage according to the adjustment signal, so that the output voltage is close to or equal to the target power supply voltage.

2. The method according to claim 1, wherein obtaining the wiring IR drop of the light-emitting substrate, the light-emitting element string IR drop of each of the plurality of light-emitting element strings, the voltage deviation of each of the plurality of light-emitting element strings, and the channel IR drop of each of the plurality of light-emitting element strings comprises:
   obtaining a temperature of the light-emitting substrate and a preset voltage of each of the plurality of light-emitting element strings;
   determining a temperature-related voltage deviation of each of the plurality of light-emitting element strings according to the temperature of the light-emitting substrate; and
   obtaining the light-emitting element string IR drop according to the temperature-related voltage deviation of each of the plurality of light-emitting element strings and the preset voltage.

3. The method according to claim 2, wherein obtaining the wiring IR drop of the light-emitting substrate, the light-emitting element string IR drop of each of the plurality of light-emitting element strings, the voltage deviation of each of the plurality of light-emitting element strings; and the channel IR drop of each of the plurality of light-emitting element strings further comprises:
   obtaining the number of the light-emitting elements of each of the plurality of the light-emitting element strings and binning information of each of the plurality of light-emitting element strings; and
   obtaining the voltage deviation of the light-emitting element string according to the number of the light-emitting elements and the binning information.

4. The method according to claim 1, wherein obtaining the wiring IR drop of the light-emitting substrate, the light-emitting element string IR drop of each of the plurality of light-emitting element strings, the voltage deviation of each of the plurality of light-emitting element strings, and the channel IR drop of each of the plurality of light-emitting element strings further comprises:
   obtaining a preset resistance of a power supply line and a preset current of a power supply line in the light-emitting substrate; and
   obtaining the wiring IR drop according to the preset resistance and the preset current.

5. The method according to claim 1; wherein generating the adjustment signal according to the comparison result of the output voltage and the power target supply voltage comprises at least one of following:
   generating a first adjustment signal in a case that the target power supply voltage is greater than the output voltage; and
   generating a second adjustment signal in a case that the target power supply voltage is less than the output voltage.

6. A driving circuit configured to drive a light-emitting assembly of a light-emitting substrate, the lighting assembly comprising a plurality of light-emitting element strings connected in parallel, and each of the plurality of light-emitting strings comprising a plurality of light-emitting elements connected in series, the driving circuit connected to the plurality of light-emitting element strings through a wiring, wherein the driving circuit comprises a power supply module, a Tx chip, and a driving chip, and the power supply module is connected to the Tx chip and the driving chip respectively, and the driving chip is further connected to the light-emitting assembly; wherein, the power supply module is configured to output an output voltage to the light-emitting assembly;

the driving chip is configured to drive the light-emitting assembly to emit light; and the Tx chip is configured to:
obtain a wiring IR drop, a light-emitting element string IR drop of each of the plurality of light-emitting element strings, a voltage deviation of each of the plurality of light-emitting element strings, and a channel IR drop of each of the plurality of light-emitting element strings;

obtain a target power supply voltage according to the wiring IR drop, the light-emitting element string IR drop of each of the plurality of light-emitting element strings, the voltage deviation of each of the plurality of light-emitting element strings, and the channel IR drop of each of the plurality of light-emitting element strings;

compare the target power supply voltage and an output voltage;

generate an adjustment signal according to a comparison result of the target power supply voltage and the output voltage; and adjust the output voltage according to the adjustment signal, so that the output voltage is close to or equal to the target power supply voltage.

7. The driving circuit according to claim 6, wherein the driving circuit further comprises a temperature sensor connected to the Tx chip, and the temperature sensor is configured to obtain a temperature of the light-emitting substrate.

8. The driving circuit according to claim 6, wherein the drive circuit further comprises a voltage detecting circuit, the voltage detecting circuit is respectively connected to the power supply module and the Tx chip, and the voltage detecting circuit is configured to detect the output voltage of the power supply module.

9. The driving circuit according to claim 8, wherein the voltage detecting circuit comprises a first resistor and a second resistor, a first end of the first circuit is connected to an output end of the power supply module, and a second end of the first resistor is connected to the Tx chip to send detected output voltage to the Tx chip, a first end of the second resistor is connected to the second end of the first resistor, and a second end of the second resistor is grounded.

10. The driving circuit according to claim 9, wherein the first resistor and the second resistor have fixed resistances, which do not vary with temperature.

11. The driving circuit according to claim 8, wherein the Tx chip comprises a comparing circuit connected to the voltage detecting circuit, and the comparing circuit is configured to compare the output voltage with the target power supply voltage and to generate an adjustment signal.

12. The driving circuit according to claim 9, wherein the Tx chip comprises a comparing circuit connected to the voltage detecting circuit, and the comparing circuit is configured to compare the output voltage with the target power supply voltage and to generate an adjustment signal.

13. The driving circuit according to claim 12, wherein the comparing circuit comprises a signal output element and a comparing element, wherein the comparing element comprises a first end connected to the second end of the first resistor, a second end connected to the target power supply voltage, and an output end connected to the comparing element.

14. The driving circuit according to claim 11, wherein the Tx chip further comprises a voltage adjusting circuit, the voltage adjusting circuit is connected to the comparing circuit and is configured to adjust the output voltage according to the adjustment signal.

15. The driving circuit according to claim 13, wherein the Tx chip further comprises a voltage adjusting circuit, the voltage adjusting circuit is connected to the comparing circuit, and is configured to adjust the output voltage according to the adjustment signal.

16. The driving circuit according to claim 15, wherein the voltage regulating circuit comprises a third resistor, a fourth resistor, and a fifth resistor, wherein a first end of the third resistor, a first end of the fourth resistor, and a first end of the fifth resistor are connected to an voltage regulating end of the power supply module, and a second end of the third resistor is connected to the output end of the power supply module, a second end of the fourth resistor is connected to the signal output element, and a second end of the fifth resistor is grounded.

17. The driving circuit according to claim 16, wherein the third resistor, the fourth resistor, and the fifth resistor have fixed resistances which do not vary with temperature.

18. A light-emitting substrate comprising a light-emitting assembly and the driving circuit according to claim 6, wherein the driving circuit is configured to drive the light-emitting assembly.

* * * * *